United States Patent [19]

Lanio et al.

[11] Patent Number: 5,021,670
[45] Date of Patent: Jun. 4, 1991

[54] MULTIPOLE ELEMENT

[75] Inventors: Stephan Lanio, Munich; Maximilian Haider, Heidelberg, both of Fed. Rep. of Germany

[73] Assignee: ICT Integrated Circuit Testing Gesellschaft für Halbleiterprüftechnik mbH, Fed. Rep. of Germany

[21] Appl. No.: 463,543

[22] Filed: Jan. 11, 1990

[30] Foreign Application Priority Data

Jan. 24, 1989 [DE] Fed. Rep. of Germany ....... 3901980

[51] Int. Cl.$^5$ .......................... H01J 29/58; H01J 29/70
[52] U.S. Cl. .......................... 250/396 R; 250/396 ML
[58] Field of Search ................... 250/396 R, 396 ML; 313/160, 153; 29/602.1

[56] References Cited

U.S. PATENT DOCUMENTS

| | | | |
|---|---|---|---|
| 2,644,106 | 6/1953 | Nordsieck | 313/160 |
| 3,028,491 | 4/1962 | Schleich | 250/396 R |
| 4,590,379 | 5/1986 | Martin | 250/396 ML |

Primary Examiner—Jack I. Berman
Assistant Examiner—Kiet T. Nguyen
Attorney, Agent, or Firm—Learman & McCulloch

[57] ABSTRACT

The multipole element has an even number of pole pieces (PS, PS') which are arranged symmetrically with respect to the optical axis (OA) of an electron beam measuring device and are rigidly connected to a ring-shaped yoke (J) by bar-shaped mounting elements (PH, PH'). A beam tube (SR), which is made from an electrically insulating material and has vacuum-tight ducts to receive the mounting elements (PH, PH') which are rigidly connected to the pole pieces (PS, PS'), is arranged coaxially with respect to the optical axis (OA) inside the yoke (J) which serves to guide the magnetic flux. The coils (SP, SP') for magnetic excitation of the pole pieces (PS, PS') are arranged on the parts of the mounting elements (PH, PH') lying outside the beam tube (SR). In order to generate an electrical multipole field suitable potentials (U, U') are applied to the pole pieces (PS, PS'). The mounting elements (PH, PH') which are guided in the bores, which are lined with an insulator (IS, IS'), of the yoke (J) and are each connected to an electrical terminal (A, A') serve as a voltage supply.

11 Claims, 4 Drawing Sheets

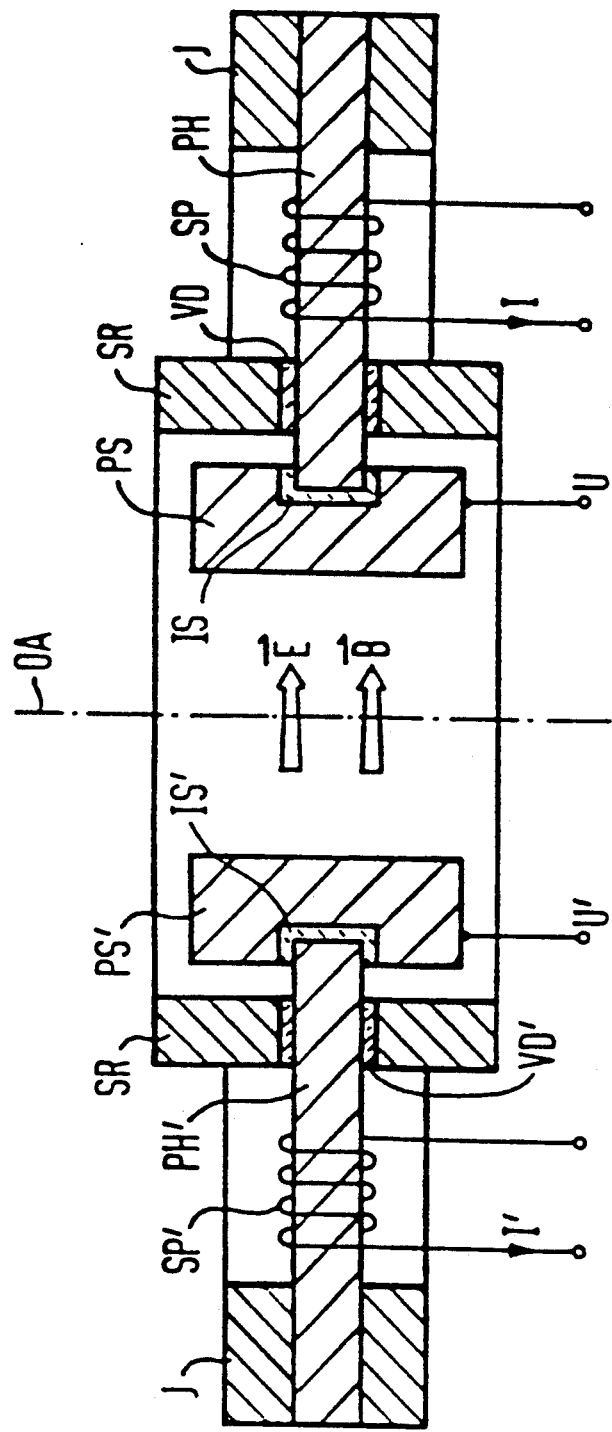

MULTIPOLE ELEMENT

BACKGROUND OF THE INVENTION

1. Technical Field

The invention relates to a multipole element for focussing the corpuscular beams in conventional electron microscopes, as well as a method of producing the same.

2. Description of the Prior Art

Round lenses are used for focussing the corpuscular beams in conventional electron microscopes, electron and ion beam recording devices, ion processing and implantation devices as well as electron been measuring devices. The geometry of these lenses which produce rotationally symmetrical electric and/or magnetic fields is optimised to small aberration constants. In systems in which rotationally symmetrical electric or magnetic fields which are not dependent on time and are free of space charge are used exclusively to produce the lens effect, the spherical aberration of the third order and the axial chromatic aberration of the first order, first degree, cannot be completely corrected in principle. This aberration limits the resolution and a correction thereof is only possible if one of the restrictions regarding the fields is waived. The transition to un-round image reproducing systems, i.e. image reproducing systems which have multipole elements for beam formation, is particularly promising.

Simple multipole elements (quadrupoles) are used for example as adjustment means or stigmators in any electron microscope. For these elements the requirements regarding the shape of the field-generating components (pole pieces, electrodes), the accuracy of the adjustment to the optical axis and the long-and short-term stability are in any case substantially less than for systems for correction or reduction of aberrations (correctors), which consist for example of several strongly focussing multipole elements arranged one behind another. These must be adjusted vary accurately with respect to one another and should not be displaced relative to one another or twisted In addition the parts of the multipole elements arranged in the vacuum should have a surface which does not allow gas to escape and they should not be contaminated or charged by the primary beam.

In the electric magnetic multipole elements which are known from Optik 60, No. 3(1982) page 307 to 326, the parts arranged in the vacuum, that is to say in particular the pole pieces, the exciting windings fixed on the pole pice mounting and the supply lines, are cast integrally in synthetic resin in order to reduce the gasemitting surface. However, this embedding technique has the disadvantage that in spite of hardening for months in a vacuum the synthetic resin emits gas, and furthermore shrinks, becomes brittle and influences the magnetic properties of the multipole element. In addition, costly shielding is necessary in order to avoid charging by the corpuscular beam.

SUMMARY OF THE INVENTION

The object of the invention is to provide a multipole element in which as few parts as possible are arranged in the vacuum. The method of producing the multipole element should in particular permit precise manufacturing of the field-generating elements.

The advantage which can be achieved with the invention resides in particular in the fact that only the elements which generate the electrical and/or magnetic field are arranged within the beam tube vacuum. This ensures a small vacuum system,
a small surface of the parts arranged in the vacuum,
no non-conductive surfaces in the region of the corpuscular beam and
a mechanically stable construction.

THE DRAWINGS

The invention will be described in greater detail below with reference to the accompanying drawings wherein:

FIGS. 1 and 2 are schematic drawings showing the construction of a multipole element of the subject invention; and FIGS. 3 (a–d) and 4 illustrate the method for the precise production of the field-generating elements.

DESCRIPTION OF THE PREFERRED EMBODIMENTS

Figure 1:
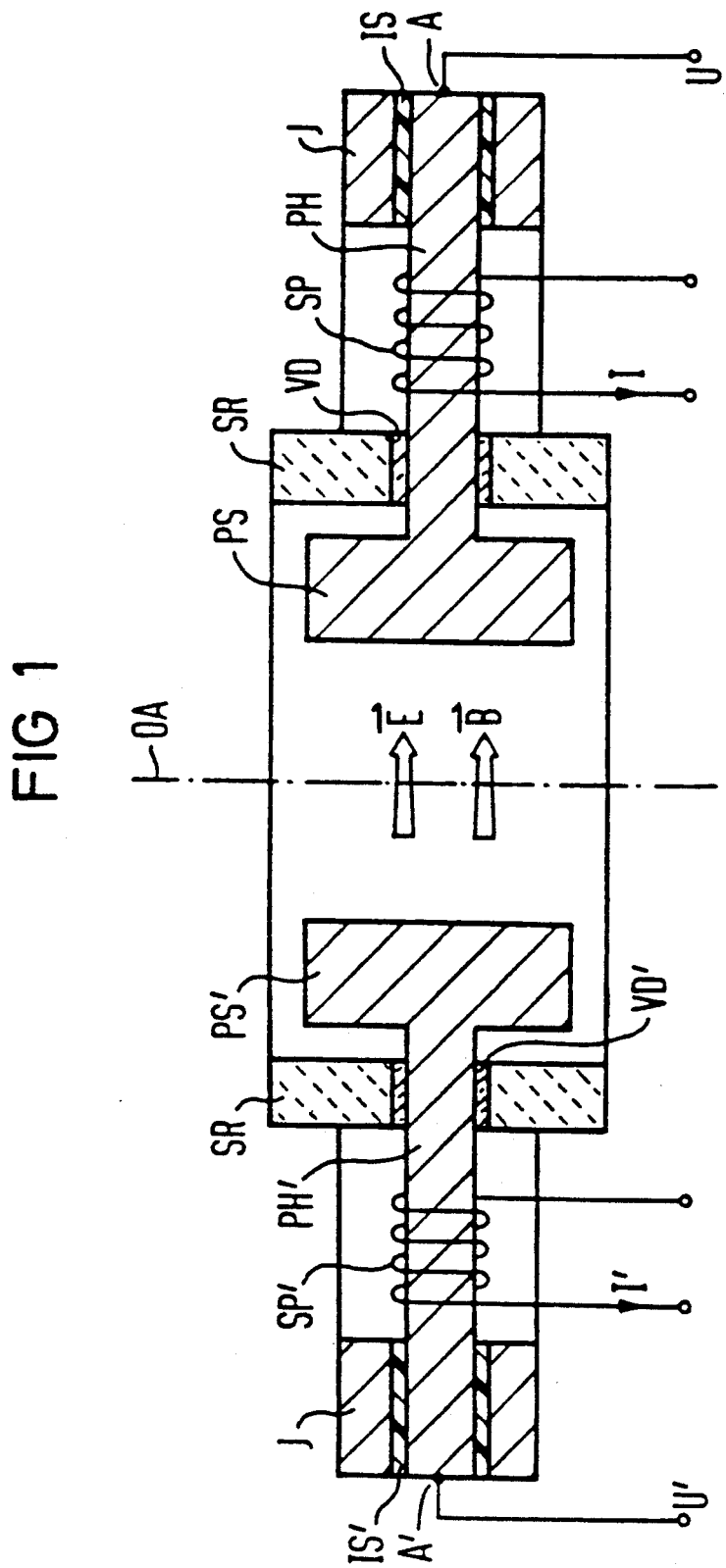
Figure 3A:
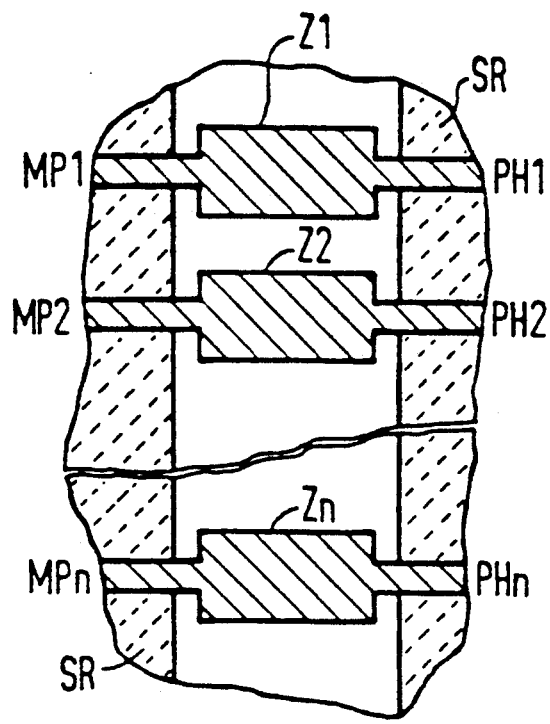
Figure 3C:
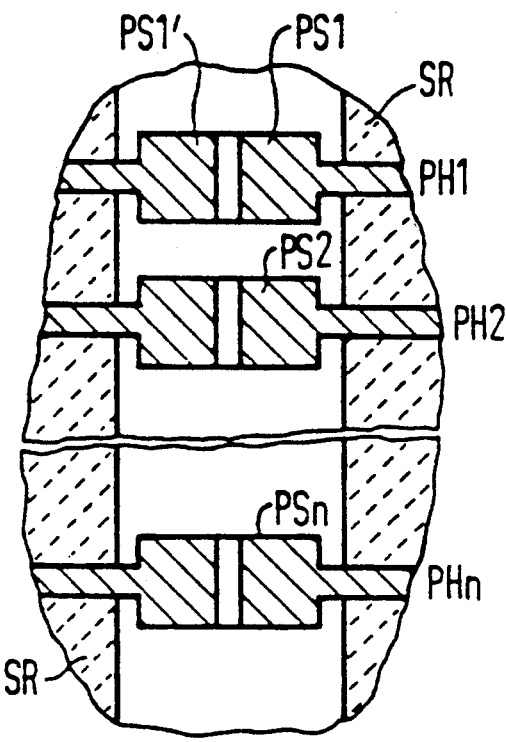
Figure 3B:
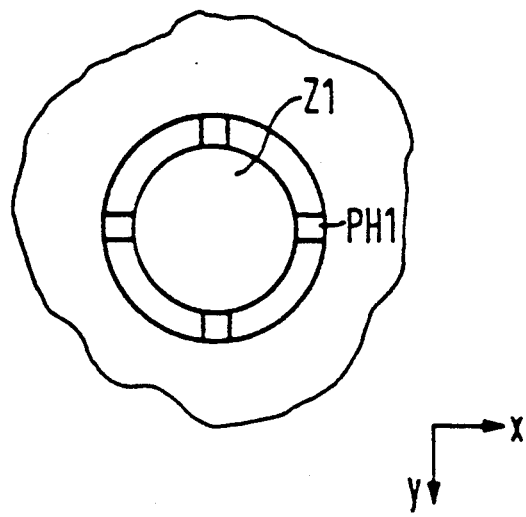
Figure 3D:
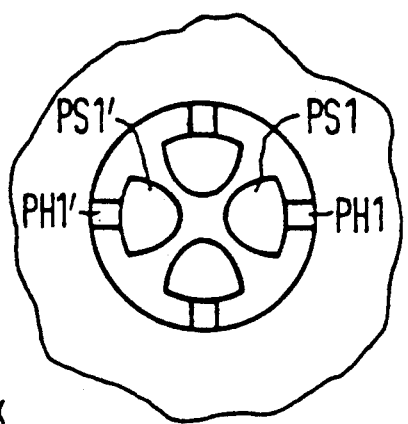

The electrical-magnetic multipole element shown in FIG. 1 can be used in particular in a corrector for improving the resolution of an electron beam measuring device. It conventionally has an even number of pole shoes PS, PS' (in FIG. 1 for reasons of clarity only 2 of the for example 8 or 12 pole shoes are shown), which are arranged symmetrically with respect to the optical axis OA of the electron beam measuring device and are rigidly connected to the ring-shaped iron circuit J (yoke) by means of bar-shaped mounting elements PH, PH'. A beam tube SR which is arranged coaxially with respect to the optical axis OA and is made from an electrically insulating material, preferably from ceramic or aluminium oxide, and has vacuum-tight ducts to receive the mounting elements PH, PH' which are screwed, glued or soldered to the pole shoes PS, PS' is provided inside the yoke J which serves to guide the magnetic flux. Metal-ceramic bonds or metal caps, which are applied to a metal coating in the region of the bores and are each soldered to the mounting elements PH, PH' made from a magnetic material, can be considered as vacuum seals VD, VD'. The parts of the mounting elements PH, PH' lying between the beam tube SR and the yoke J carry the coils SP, SP' for individual magnetic excitation of the pole shoes PS, PS'. The currents I, I' flowing in the coils SP, SP' are present so that the desired magnetic multipole field B is built up within the evacuated beam tube SR. In order to generate an electric multipole field the corresponding potentials U, U' are applied to the pole pieces PS, PS'. The mounting elements PH, PH' which are guided in the bores, which are lined with an insulator IS, IS', of the yoke J and are connected respectively to the electrical terminals A, A' serve as voltage supplies.

The beam tube SR can be made from a conductive material, that is to say it can be made in particular from metal, if insulators are used as vacuum seals VD, VD'.

In the embodiment of an electric-magnetic multipole element illustrated in FIG. 2 the electrical insulation takes place at the transition of the mounting elements PH, PH' to the pole pieces PS, PS', and the pole pieces PS, PS' which are provided with insulators IS, IS' are fixed on the mounting elements PH, PH' by adhesion or by a metal-ceramic bond.

A corpuscular optical system consisting of one or more multipole elements only fulfils the set requirements when the field-generating elements (pole pieces in the case of magnetic multipoles or electrodes in the case of electrical multipoles) are produced very accurately, i.e. with the smallest possible tolerances. Therefore, in the production of a multipole element care should be taken to ensure that the field-generating elements have the same shape.

that the field-generating elements are the same distance from the optical axis QA, and that the distances between adjacent field-generating elements are equal. If the corpusular optical system consists of several multipole elements it is also necessary to ensure that the individual components are not displaced with respect to one another or twisted (coaxial or azimuthal adjustment).

In the known method for producing a corrector, the coaxial and azimuthal adjustment creates difficulties since the electric magnetic multipole elements are produced individually and then assembled of form an overall system. Moreover, in the assembly of the individual elements considerable caution is required in order not to disturb the adjustment of the pole pieces which is carried out before commencement of the production process.

Since the pole pieces are generally defined by cylindrical surfaces on the side facing the beam tube SR, they can be produced by cutting from a circular cylinder. The method according to the invention therefore provides for the multipole element or a number of multipole elements MP1, MP2, MPn to be largely assembled first of all, in which case instead of prepared individual pole pieces PS1, PS1', PS2, PSn the circular cylinders Z1, Z2, Zn made from soft magnetic material are first of all arranged inside the yokes and rigidly connected thereto by mounting elements PH1, PH1', PH2, PHn (see FIG. 3 a, b, which show a multipole optical system consisting of several quadrupoles in side view and in plan view). After conclusion of all of the assembly work, which exerts forces on the pole shoes and thus can endanger the adjustment, but particularly after the assembly of the individual elements MP1, MP2, MPn to form the overall system, all cylinders Z1, Z2, Zn are cut in the same operation and the interior surfaces of the pole pieces PS1, PS1', PS2, PSn are formed (see FIG. 3 c, d). Consequently the individual multipole elements MP1, MP2, MPn are mechanically adjusted with respect to one another very accurately. Naturally force-free cutting processes are used in order to avoid mechanical stress and deformations.

Figure 4:
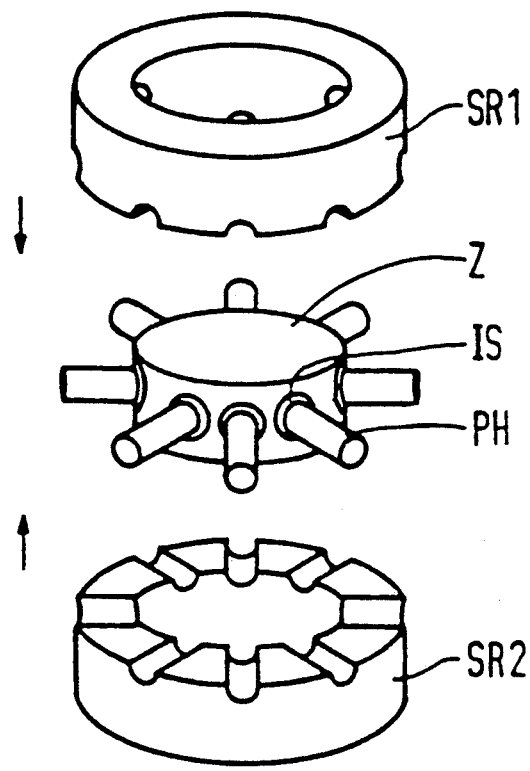

As FIG. 4 shows, the beam tube can also consist of an upper part SR1 and a lower part SR2 into which the prepared unit consisting of circular cylinder Z, insulators IS and mounting elements PH are laid and glued or soldered.

Naturally, the invention is not restricted to the described embodiments. It is easily possible to use oversize preformed individual parts instead of the circular cylinders Z1, Z2, Zn.

In the production of an electric multipole element no yoke is required, nor are mounting elements protruding out of the beam tube. Simple contacting is sufficient for applying a potential to the field-generating electrodes (these can cosist of a conductive material or of a nonconductive material provided with a conductive coating).

We claim:

1. Multipole element with a mounting part (J) carrying mounting elements, with several field-generating elements (PS, PS') which are arranged symmetrically with respect to an axis of symmetry (OA) of the mounting part (J) and are rigidly connected to the latter by said mounting elements (PH, PH') and with a coil system (SP, SP') for magnetic excitation of the field-generating elements (PS, PS'), characterised in that the field-generating elements (PS, PS') are arranged inside a beam tube (SR) for a corpuscular beam, said beam tube (SR) being arranged coaxially within the mounting part (J) and having vacuum-tight ducts for mounting elememts (PH, PH').

2. Multipole element as claimed in claim 1, characterised in that the coil system has a number of coil units (SP, SP') corresponding to the number of field-generating elements (PS, PS') and that the coil units (SP, SP') are arranged outside the beam tube (SR) on the mounting elements (PH, PH').

3. Multipole elment as claimed in claims 1 or 2, characterised in that a metal cap which is arranged on one outer side of the beam tube (SR) and is connected to the respective mounting element (PH, PH') closes off the ducts so that they are vacuum-tight.

4. Multipole element as claimed in claim 3, characterised by bar-shaped mounting elements (PH, PH').

5. Multipole element as claimed in claim 4, characterised in that the vacuum-tight ducts are electrically insulating.

6. Multipole element as claimed in claim 5, characterised in that the beam tube (SR) is made from a non-conductive material.

7. Multipole element as claimed in claim 6, characterised in that the beam tube (SR) is made from a ceramic material.

8. Multipole element as claimed in claim 7, characterised in that the mounting part (J) is electrically insulated from the mounting elements (PH, PH') and that the mounting elements (PH, PH') are connected to electrical terminals (A, A') for applying a potential (U, U') to the field-generating elements (PS, PS').

9. Multipole element as claimed in claim 4, characterised in that the mounting elements (PH, PH') are connected to the field-generating elements in an electrically insulating manner and that the field-generating elements (PS, PS') have electrical terminals (A, A').

10. Multipole elements as claimed in claim 9, characterised in that the mounting part (J) is of ring-shaped construction and made from a material which conducts a magnetic flux.

11. Multipole element as claimed in claim 10, characterised in that the field-generating elements (PS, PS') are made from a soft magnetic material.

* * * * *

UNITED STATES PATENT AND TRADEMARK OFFICE
CERTIFICATE OF CORRECTION

PATENT NO. : 5,021,670

DATED : June 4, 1991

INVENTOR(S) : Stefan Lanio and Maximilian Haider

It is certified that error appears in the above-identified patent and that said Letters Patent is hereby corrected as shown below:

Column 1, line 14, change "been" to -- beam --; line 40, change "vary" to -- very --; line 42, after "twisted" insert -- . --; line 50, change "pice" to -- piece --; and change "mounting" to -- mountings --.

Column 2, line 47, change "present" to -- preset --.

Column 3, line 9, change "QA" to -- OA --; line 19, change "of" to -- to --.

Column 4, line 3, change "cosist" to -- consist --; and line 26, change "elment" to -- element --.

Signed and Sealed this

Twenty-second Day of September, 1992

Attest:

DOUGLAS B. COMER

*Attesting Officer*   *Acting Commissioner of Patents and Trademarks*